(12) United States Patent
Komatsu et al.

(10) Patent No.: US 9,487,868 B2
(45) Date of Patent: Nov. 8, 2016

(54) PATTERN-FORMING METHOD

(71) Applicant: JSR CORPORATION, Tokyo (JP)

(72) Inventors: Hiroyuki Komatsu, Tokyo (JP); Takehiko Naruoka, Tokyo (JP); Shinya Minegishi, Tokyo (JP); Kaori Sakai, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/591,323

(22) Filed: Jan. 7, 2015

(65) Prior Publication Data
US 2015/0191829 A1    Jul. 9, 2015

(30) Foreign Application Priority Data

Jan. 7, 2014    (JP) .................. 2014-001121
Dec. 26, 2014    (JP) .................. 2014-266641

(51) Int. Cl.
| | |
|---|---|
| *C23F 1/02* | (2006.01) |
| *C23F 1/12* | (2006.01) |
| *G03F 7/00* | (2006.01) |
| *H01L 21/308* | (2006.01) |
| *C08F 297/02* | (2006.01) |
| *C09D 153/00* | (2006.01) |

(52) U.S. Cl.
CPC ............... *C23F 1/02* (2013.01); *C08F 297/02* (2013.01); *C09D 153/00* (2013.01); *C23F 1/12* (2013.01); *G03F 7/0002* (2013.01); *H01L 21/3081* (2013.01)

(58) Field of Classification Search
USPC .......................................... 215/49
See application file for complete search history.

(56) References Cited

U.S. PATENT DOCUMENTS

| | | | | |
|---|---|---|---|---|
| 3,854,961 | A | * 12/1974 | Flasch ...................... | B22C 9/04 106/38.3 |
| 5,605,723 | A | * 2/1997 | Ogi ......................... | G03F 7/004 257/E27.104 |
| 2002/0044163 | A1 | * 4/2002 | Shigemura .................. | B41J 2/01 347/1 |
| 2013/0078570 | A1 | * 3/2013 | Hieno ....................... | B32B 7/04 430/270.1 |
| 2013/0180948 | A1 | * 7/2013 | Takizawa ................... | G11B 5/855 216/22 |
| 2015/0069315 | A1 | * 3/2015 | Shih ........................ | H01L 45/16 257/4 |

FOREIGN PATENT DOCUMENTS

| | | |
|---|---|---|
| JP | 2001-284209 A | 10/2001 |
| JP | 2008-039811 A | 2/2008 |
| JP | 2010-085912 A | 4/2010 |

\* cited by examiner

*Primary Examiner* — Shamim Ahmed
(74) *Attorney, Agent, or Firm* — Oblon, McClelland, Maier & Neustadt, L.L.P.

(57) ABSTRACT

A pattern-forming method includes providing a metal-containing film directly or indirectly on a substrate. A directed self-assembling film is provided directly or indirectly on the metal-containing film such that a plurality of phases of the directed self-assembling film is formed. At least a part of the plurality of phases of the directed self-assembling film is removed such that a pattern of the directed self-assembling film is formed. The metal-containing film and the substrate are sequentially etched using the pattern of the directed self-assembling film as a mask.

13 Claims, No Drawings

PATTERN-FORMING METHOD

CROSS-REFERENCE TO RELATED APPLICATIONS

The present application claims priority to Japanese Patent Application No. 2014-001121, filed Jan. 7, 2014, and to Japanese Patent Application No. 2014-266641, filed Dec. 26, 2014. The contents of these applications are incorporated herein by reference in their entirety.

BACKGROUND OF THE INVENTION

1. Field of the Invention

The present invention relates to a pattern-forming method.

2. Discussion of the Background

In the field of manufacture of semiconductors and the like, a reduction in processing size has progressed by utilizing a multilayer resist process in order to achieve a higher degree of integration. The multilayer resist process includes providing an inorganic film on a substrate, then applying a resist composition or the like to the inorganic film to provide a resist film that differs in etching selectivity ratio from the inorganic film, thereafter transferring a mask pattern to the resist film via an exposure, and developing the resist film with a developer to form a resist pattern. Subsequently, the resist pattern is transferred to the inorganic film by dry etching, and the pattern of the inorganic film is finally transferred to the substrate to form a desired pattern on the substrate (see Japanese Unexamined Patent Application, Publication Nos. 2001-284209, 2010-85912 and 2008-39811).

SUMMARY OF THE INVENTION

According to one aspect of the present invention, a pattern-forming method includes providing a metal-containing film directly or indirectly on a substrate. A directed self-assembling film is provided directly or indirectly on the metal-containing film such that a plurality of phases of the directed self-assembling film is formed. At least a part of the plurality of phases of the directed self-assembling film is removed such that a pattern of the directed self-assembling film is formed. The metal-containing film and the substrate are sequentially etched using the pattern of the directed self-assembling film as a mask.

DESCRIPTION OF THE EMBODIMENTS

According to an embodiment of the invention made for solving the aforementioned problems, a pattern-forming method includes: providing a metal-containing film directly or indirectly on a substrate; providing a directed self-assembling film directly or indirectly on the metal-containing film such that a plurality of phases of the directed self-assembling film is formed (hereinafter, may be also referred to as "directed self-assembling film-providing step"); removing at least a part of the plurality of phases of the directed self-assembling film such that a pattern of the directed self-assembling film is formed (hereinafter, may be also referred to as "removing step"); and sequentially etching the metal-containing film and the substrate using the pattern of the directed self-assembling film as a mask (hereinafter, may be also referred to as "etching step").

According to the pattern-forming method of the embodiment of the present invention, a substrate pattern that is finer and superior in rectangularity can be formed. Therefore, the pattern-forming method can be suitably used for lithography processes in manufacture of various types of electronic devices such as semiconductor devices and liquid crystal devices for which further miniaturization is demanded.

The embodiments of the present invention will now be described in detail.

Pattern-Forming Method

The pattern-forming method according to an embodiment of the present invention includes the directed self-assembling film-providing step, the removing step, and the etching step. It is preferred that the pattern-forming method further includes providing an organic underlayer film on the substrate (hereinafter, may be also referred to as "organic underlayer film-providing step") before the directed self-assembling film-providing step, and that the organic underlayer film is etched when the metal-containing film and the substrate is sequentially etched. The pattern-forming method may include providing a metal-containing film directly or indirectly on the substrate (hereinafter, may be also referred to as "metal-containing film-providing step") for the purpose of obtaining a substrate having a metal-containing film overlaid directly or indirectly thereon.

According to the pattern-forming method, a substrate pattern that is finer and superior in rectangularity can be formed. In the pattern-forming method, a fine directed self-assembling pattern is formed, and a substrate pattern is formed through a multilayer resist process involving a metal-containing film which permits a reduction of the film thickness. Thus, a transfer of a fine configuration can be achieved without collapse of a mask, and the like in the course of the transfer, and in turn, a substrate pattern that is finer and superior in rectangularity can be obtained. Hereinafter, each step will be explained.

Organic Underlayer Film-Providing Step

The pattern-forming method according to the embodiment of the present invention may include providing an organic underlayer film on the substrate, before the directed self-assembling film-providing step described later. Examples of the substrate include insulating films such as silicon oxide, silicon nitride, silicon nitride oxide and polysiloxanes, as well as interlayer insulating films such as wafers covered with a low-dielectric insulating film such as Black Diamond™ (manufactured by AMAT), SiLK™ (manufactured by Dow Chemical) and LKD5109 (manufactured by JSR), which are commercially available products. Polysilicon, as well as metal gate films as generally referred to, which are polysilicon into which a metal component is implanted, and the like are also included. Moreover, substrates patterned so as to have wiring grooves (trenches), plug grooves (vias) or the like may be used as the substrate.

Examples of the organic underlayer film include organic films provided using a composition for an organic underlayer film, carbon films provided through a conventionally well-known chemical vapor deposition (CVD) process, and the like. As the composition for forming an organic underlayer film, conventionally well-known compositions for use in forming an organic underlayer film may be used, and examples thereof include NFC HM8005 (manufactured by JSR) and the like. In an exemplary method for providing the organic underlayer film, the organic underlayer film may be provided by coating a composition for forming an organic underlayer film on a substrate to provide a coating film, and subjecting the coating film to a heat treatment, or irradiation with ultraviolet light and a heat treatment to allow curing thereof. Examples of the process for coating the composition for forming an organic underlayer film include a spin coating process, a roll coating process, a dip coating process, and the like. Moreover, the heating temperature is typically 150° C. to 500° C., and preferably 180° C. to 350° C. The heating time period is typically 30 sec to 1,200 sec, and preferably 45 sec to 600 sec. The film thickness of the organic underlayer film is typically about 50 nm to about 500 nm.

In addition, other underlayer film distinct from the organic underlayer film provided using the composition for forming an organic underlayer film may be provided on the surface of the substrate or the organic underlayer film. This other underlayer film is a film to which a reflection-preventing function, flatness, superior etching resistance against fluorine-based gases such as $CF_4$, and the like are imparted.

Metal-Containing Film-Providing Step

According to this step, a substrate having a metal-containing film overlaid directly or indirectly thereon is obtained. In the case of having provided the organic underlayer film on the substrate, the metal-containing film is provided on the organic underlayer film. The term "metal-containing film" means a film that contains a metal element and has a percentage content of the metal element of preferably no less than 50% by mass, and more preferably no less than 60% by mass. The metal-containing film is not particularly limited as long as the metal-containing film exhibits the properties described above; and examples thereof include metal films, metal oxide-containing films, metal nitride-containing films, and the like.

The method for providing the metal-containing film is not particularly limited, and examples thereof include: methods that involve coating a composition for forming a metal-containing film; methods involving physical vapor deposition such as vacuum deposition; methods involving CVD such as plasma CVD, thermal CVD and ambient pressure CVD; methods that involve sputtering; methods involving PVD such as ion plating; and the like. Of these, the methods that involve coating a composition for forming a metal-containing film are preferred in light of the ease of providing the metal-containing film.

According to the method that involves coating a composition for forming a metal-containing film, specifically, the metal-containing film may be provided, for example, by coating the composition for forming a metal-containing film on the surface of the substrate to provide a coating film, and subjecting the coating film to a heat treatment, or irradiation with ultraviolet light and a heat treatment to allow curing thereof.

Composition for Forming Metal-Containing Film

The composition for forming a metal-containing film is not particularly limited as long as the metal-containing film can be provided. However, in light of more convenient formation of the metal-containing film and an improvement of the productivity of multilayer resist processes, a composition is preferred which contains: (A) at least one compound (hereinafter, may be also referred to as "(A) compound" or "compound (A)") selected from the group consisting of a metal compound having a hydrolyzable group, a hydrolysis product of a metal compound having a hydrolyzable group, and a hydrolytic condensation product of a metal compound having a hydrolyzable group; and (B) an organic solvent. Moreover, the composition may suitably contain (C) water and (D) a crosslinking accelerator, and may contain a surfactant and the like.

(A) Compound

The compound (A) is at least one compound selected from the group consisting of a metal compound having a hydrolyzable group, a hydrolysis product of a metal compound having a hydrolyzable group, and a hydrolytic condensation product of a metal compound having a hydrolyzable group.

The metal element in the compound (A) is not particularly limited. However, in light of etching selectivity ratio, at least one metal element (hereinafter, may be also referred to as "specific element") selected from the group consisting of a group 3 element, a group 4 element, a group 5 element, a group 6 element, a group 12 element and a group 13 element is preferred.

Examples of the specific element include:
group 3 elements such as Sc (scandium) and Y (yttrium);
group 4 elements such as Ti (titanium), Zr (zirconium) and Hf (hafnium);
group 5 elements such as V (vanadium), Nb (niobium) and Ta (tantalum);
group 6 elements such as Cr (chromium), Mo (molybdenum) and W (tungsten);
group 12 elements such as Zn; and
group 13 elements such as Al (aluminum), Ga (gallium), In (indium) and Tl (thallium).

Of these specific elements, zirconium, hafnium, tungsten, aluminum, vanadium and titanium are preferred, and zirconium and titanium are more preferred.

Among the alternatives of the compound (A), the metal compound having a hydrolyzable group is preferably a metal alkoxide, a metal carboxylate or a metal complex.

Metal Alkoxide

The metal alkoxide is a compound derived by replacing the hydrogen atom of a hydroxy group included in an alcohol with a metal element atom, and is represented by the following formula (1).

$$M(OR^1)_a \qquad (1)$$

In the above formula (1), M represents a metal element atom; a is an integer of 1 to 7 corresponding to the valency of the atom M; and $R^1$ represents an alkyl group having 1 to 10 carbon atoms and optionally including an alkoxy group, or a cycloalkyl group having 3 to 10 carbon atoms and optionally including an alkoxy group, wherein in a case where $R^1$ is present in a plurality of number, a plurality of $R^1$ s are identical or different.

The alcohol is preferably a compound represented by the following formula (2), for example.

$$R^2OH \qquad (2)$$

In the above formula (2), $R^2$ is identical to $R^1$ defined in connection with the above formula (1).

Examples of the compound represented by the above formula (2) in a case where $R^2$ represents an alkyl group or a cycloalkyl group include methanol, ethanol, 1-propanol, 2-propanol, n-butanol, sec-butanol, pentanol, cyclohexanol, and the like. Examples of the compound represented by the above formula (2) in a case where $R^2$ represents an alkyl group substituted with an alkoxy group or a cycloalkyl group substituted with an alkoxy group include methoxymethanol, methoxyethanol, ethoxymethanol, ethoxyethanol, methoxypropanol, ethoxypropanol, propoxypropanol, and the like.

Of these, ethanol is more preferred.

Metal Carboxylate

The metal carboxylate is a compound derived by replacing the hydrogen atom of a carboxy group included in a carboxylic acid with a metal element atom, and is represented by the following formula (3).

$$M(OCOR^3)_a \qquad (3)$$

In the above formula (3), M and a are as defined in the above formula (1); and $R^3$ represents an organic group, wherein in a case where $R^3$ is present in a plurality of number, a plurality of $R^3$s are identical or different.

The carboxylic acid is preferably a compound represented by the following formula (4), for example.

$$R^4COOH \tag{4}$$

In the above formula (4), $R^4$ is identical to $R^3$ defined in connection with the above formula (3).

Examples of the compound represented by the above formula (4) include acetic acid, trifluoroacetic acid, 2-methylpropanoic acid, pentanoic acid, 2,2-dimethylpropanoic acid, butanoic acid, hexanoic acid, 2-ethylhexanoic acid, octanoic acid, nonanoic acid, decanoic acid, acrylic acid, methacrylic acid, salicylic acid, and the like.

Metal Complex

The metal complex is a compound having a hydrolyzable group bonded to a metal element atom, and is represented by the following formula (5).

$$M(OR^1)_b(OCOR^3)_cR^5_d \tag{5}$$

In the above formula (5), M and $R^1$ are as defined in the above formula (1); $R^3$ is as defined in the above formula (3); b and c are each independently an integer of 0 to 7, wherein a sum of b and c corresponds to the valency of the atom M; d is an integer of 0 to 7; and $R^5$ represents an organic compound, wherein in a case where $R^5$ is present in a plurality of number, a plurality of $R^5$s are identical or different.

The organic compound represented by $R^5$ is exemplified by an ether represented by the following formula (6).

$$R^6OR^7 \tag{6}$$

In the above formula (6), $R^6$ and $R^7$ each independently represent a saturated or unsaturated hydrocarbon group having 1 to 10 carbon atoms and optionally including an oxygen atom in the skeleton chain thereof, wherein $R^6$ and $R^7$ optionally taken together represent a ring structure.

Examples of the ether represented by the above formula (6) include methylal, diethyl ether, dipropyl ether, dibutyl ether, diamyl ether, diethyl acetal, dihexyl ether, trioxane, dioxane, and the like.

Moreover, the organic compound represented by $R^5$ is also exemplified by a ketone represented by the following formula (7) or formula (8).

$$R^8R^9C=O \tag{7}$$

$$R^{10}(C=O)CH_2(C=O)R^{11} \tag{8}$$

In the above formulae (7) and (8), $R^8$ and $R^{10}$ each independently represent a saturated or unsaturated hydrocarbon group having 1 to 10 carbon atoms and optionally including a keto group in the skeleton chain thereof; and $R^9$ and $R^{11}$ each independently represent a saturated or unsaturated hydrocarbon group having 1 to 10 carbon atoms.

Examples of the ketone represented by the above formula (7) or (8) include acetone, methyl ethyl ketone, methyl propyl ketone, methyl isobutyl ketone, methyl amyl ketone, methyl cyclohexyl ketone, diethyl ketone, ethyl butyl ketone, trimethylnonanone, acetonylacetone, mesityl oxide, cyclohexanone, dieacetone alcohol (4-hydroxy-4-methyl-2-pentanone), acetylacetone (2,4-pentanedione), 2,4-trifluoropentanedione, 2,4-hexafluoropentanedione, ethyl acetoacetate, 2,2,6,6-tetramethyl-3,5-heptanedione, 1,3-diphenyl-1,3-propanedione, 1-phenyl-1,3-butanedione, and the like.

Furthermore, the organic compound represented by $R^5$ is also exemplified by an ester represented by the following formula (9), for example.

$$R^{14}COOR^{15} \tag{9}$$

In the above formula (9), $R^{14}$ represents a saturated or unsaturated hydrocarbon group having 1 to 10 carbon atoms and optionally including a keto group, a hydroxy group or an alkoxy group; and $R^{15}$ represents a saturated or unsaturated hydrocarbon group having 1 to 10 carbon atoms and optionally including an alkoxy group.

Examples of the ester represented by the above formula (9) include ethyl formate, methyl acetate, ethyl acetate, butyl acetate, cyclohexyl acetate, methyl propionate, ethyl butyrate, ethyl oxyisobutyrate, ethyl acetoacetate, ethyl lactate, methoxybutyl acetate, diethyl oxalate, diethyl malonate, and the like.

The hydrolysis product can be obtained by hydrolyzing the metal compound having a hydrolyzable group, and the hydrolytic condensation product can be obtained by further condensing the hydrolysis product. The hydrolysis is executed through adding water, or water and a catalyst to the metal compound having a hydrolyzable group, and stirring the mixture at 20° C. to 100° C. for several hours to several days. The amount of water added with respect to 1 mol of the metal compound having a hydrolyzable group is typically no greater than 100 mol, and preferably 5 mol to 50 mol. Examples of the catalyst include: acid catalysts, e.g., inorganic acids such as hydrochloric acid, sulfuric acid and nitric acid, and organic acids such as acetic acid, propionic acid, butyric acid and maleic acid; inorganic or organic alkali catalysts such as sodium hydroxide, potassium hydroxide, ammonia, monoethanolamine, diethanolamine and tetramethylammonium hydroxide; and the like.

(B) Organic Solvent

The organic solvent (B) is exemplified by an alcohol solvent, a ketone solvent, an amide solvent, an ether solvent, an ester solvent, a mixed solvent thereof, and the like. These solvents may be used either alone or in combination of two or more thereof.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partial ether solvents having 3 to 19 carbon atoms such as propylene glycol monomethyl ether; and the like.

Examples of the ether solvent include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole; and the like.

Examples of the ketone solvent include:
chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;
cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as butyl acetate, ethyl lactate and butoxymethyl acetate;

polyhydric alcohol carboxylate solvents such as propylene glycol acetate;

polyhydric alcohol partial ether carboxylate solvents such as propylene glycol monomethyl ether acetate;

polyhydric carboxylic acid ester solvents such as diethyl oxalate;

carbonate solvents such as dimethyl carbonate and diethyl carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these organic solvents (B), propylene glycol monomethyl ether and propylene glycol monoethyl ether are preferred.

The content of the organic solvent (B) is preferably such a content that gives the content of the compound (A) in the composition for forming a metal-containing film of 0.5% by mass to 20% by mass, and preferably 0.5% by mass to 15% by mass in terms of metal oxide equivalent.

(C) Water

The composition for forming a metal-containing film preferably further contains (C) water. When the composition for forming a metal-containing film further contains the water (C), a reaction for forming the metal-containing film can be accelerated. The water (C) is not particularly limited, and examples thereof include distilled water, ion exchanged water, and the like. The content of the water (C) with respect to 100 parts by mass of the composition for forming a metal-containing film is preferably 0.1 parts by mass to 10 parts by mass, and more preferably 1 part by mass to 8 parts by mass.

(D) Crosslinking Accelerator

The composition for forming a metal-containing film preferably further contains the crosslinking accelerator (D). The crosslinking accelerator (D) is a compound that generates an acid or a base by means of light or heat, and when the composition for forming a metal-containing film further contains the crosslinking accelerator (D), the etching selectivity ratio of the provided metal-containing film can be improved. The crosslinking accelerator (D) is exemplified by an onium salt compound, an N-sulfonyloxyimide compound, and the like. The crosslinking accelerator (D) is preferably a thermal crosslinking accelerator that thermally generates an acid or a base, and among the compounds exemplified, an onium salt compound is more preferred.

The onium salt compound is exemplified by a sulfonium salt, a tetrahydrothiophenium salt, an iodonium salt, an ammonium salt, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylsulfonium 1,1,2,2-tetrafluoro-6-(1-adamantanecarbonyloxy)-hexane-1-sulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo[2.2.1]hept-2-yl-1,1,2,2-tetrafluoroethanesulfonate, 1-(6-n-butoxynaphthalen-2-yl) tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl) tetrahydrothiophenium perfluoro-n-octanesulfonate, 1-(6-n-butoxynaphthalen-2-yl)tetrahydrothiophenium 2-bicyclo [2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyptetrahydrothiophenium perfluoro-n-octanesulfonate, 1-(3,5-dimethyl-4-hydroxyphenyl)tetrahydrothiophenium 2-bicyclo[2.2.1]hept-2-yl-1, 1,2,2-tetrafluoroethanesulfonate, and the like.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2, 2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like.

Examples of the ammonium salt include ammonium formate, ammonium maleate, ammonium fumarate, ammonium phthalate, ammonium malonate, ammonium succinate, ammonium tartrate, ammonium malate, ammonium lactate, ammonium citrate, ammonium acetate, ammonium propionate, ammonium butanoate, ammonium pentanoate, ammonium hexanoate, ammonium heptanoate, ammonium octanoate, ammonium nonanoate, ammonium decanoate, ammonium oxalate, ammonium adipate, ammonium sebacate, ammonium butyrate, ammonium oleate, ammonium stearate, ammonium linoleate, ammonium linolenate, ammonium salicylate, ammonium benzenesulfonate, ammonium benzoate, ammonium p-aminobenzoate, ammonium p-toluenesulfonate, ammonium methanesulfonate, ammonium trifluoromethanesulfonate, ammonium trifluoroethanesulfonate, and the like. In addition, ammonium salts which are derived by replacing the ammonium ion of the above-exemplified ammonium salts with a methylammonium ion, a dimethylammonium ion, a trimethylammonium ion, a tetramethylammonium ion, an ethylammonium ion, a diethylammonium ion, a triethylammonium ion, a tetraethylammonium ion, a propylammonium ion, a dipropylammonium ion, a tripropylammonium ion, a tetrapropylammonium ion, a butylammonium ion, a dibutylammonium ion, a tributylammonium ion, a tetrabutylammonium ion, a trimethylethylammonium ion, a dimethyldiethylammonium ion, a dimethylethylpropylammonium ion, a methylethylpropylbutylammonium ion, an ethanolammonium ion, a diethanolammonium ion, a triethanolammonium ion or the like are also included. Furthermore, 1,8-diazabicyclo[5.4.0]undec-7-ene salts, 1,5-diazabicyclo[4.3.0]-5-nonene salts and the like are also included. The 1,8-diazabicyclo[5.4.0]undec-7-ene salts are exemplified by a 1,8-diazabicyclo[5.4.0]undec-7-ene formate salt, 1,8-diazabicyclo[5.4.0]undec-7-ene p-toluenesulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, and the like.

Of these crosslinking accelerators (D), diphenyliodonium trifluoromethanesulfonate, diphenyliodonium nonafluoro-n-butanesulfonate, diphenyliodonium perfluoro-n-octanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, tetraalkylammonium salts and 1,8-diazabicyclo[5.4.0]undec-7-ene salts are preferred.

These crosslinking accelerators (D) may be used either alone, or two or more types thereof may be used in combination. The content of the crosslinking accelerator (D) with respect to 100 parts by mass of the compound (A) is preferably no greater than 10 parts by mass, and more preferably no less than 0.1 parts by mass and no greater than 5 parts by mass. When the content of the crosslinking accelerator (D) falls within the above range, the etching selectivity ratio of the provided metal-containing film can be improved.

Surfactant

The surfactant exhibits the effect of improving a coating property, striation and the like of the composition for forming a metal-containing film. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; and the like. Examples of commercially available products of the surfactant include: KP341 (manufactured by Shin-Etsu Chemical Co., Ltd.); Polyflow No. 75 and Polyflow No. 95 (each manufactured by Kyoeisha Chemical Co., Ltd.); EFTOP EF301, EFTOP EF303 and EFTOP EF352 (each manufactured by Tochem Products Co. Ltd.); Megaface F171 and Megaface F173 (each manufactured by Dainippon Ink And Chemicals, Incorporated); Fluorad FC430 and Fluorad FC431 (each manufactured by Sumitomo 3M Limited); ASAHI GUARD AG710, Surflon S-382, Surflon SC-101, Surflon SC-102, Surflon SC-103, Surflon SC-104, Surflon SC-105 and Surflon SC-106 (each manufactured by Asahi Glass Co., Ltd.); and the like.

The surfactant may be used either alone, or two or more types thereof may be used in combination. Moreover, the amount of the surfactant blended may be appropriately selected in accordance with the purpose of the blending.

The composition for forming a metal-containing film may be prepared by dissolving or dispersing the compound (A), as well as the water (C), the crosslinking accelerator (D) and other component(s) as needed in the organic solvent (B) in a predetermined ratio, and thereafter filtering the solution or dispersion typically through a filter with a pore size of, for example, about 0.2 µm.

Examples of the process for coating the composition for forming a metal-containing film include a spin coating process, a roll coating process, a dip coating process, and the like. Moreover, the heating temperature is typically 150° C. to 500° C., and preferably 180° C. to 350° C. The heating time period is typically 30 sec to 1,200 sec, and preferably 45 sec to 600 sec. Furthermore, the composition for forming a metal-containing film may be irradiated with ultraviolet light after the coating thereof. The film thickness of the provided metal-containing film is typically 5 nm to 50 nm.

Directed Self-Assembling Film-Providing Step

According to this step, a directed self-assembling film having a phase separation structure is provided directly or indirectly on the metal-containing film provided as described above, such that a plurality of phases of the directed self-assembling film is formed. The directed self-assembling film may be provided, for example, by: coating, on the provided metal-containing film or the like, a composition for forming a directed self-assembling film that contains a component capable of forming a phase separation structure through directed self-assembling, or the like to provide a coating film, and allowing directed self-assembling of the component in the coating film to be induced; and the like.

In the present specification, the term "directed self-assembling" as referred to means a phenomenon of spontaneously constructing a tissue or structure without resulting from only the control from an external factor. According to the embodiment of the present invention, a pattern (directed self-assembling pattern) can be formed by, for example, coating, e.g., a composition for forming a directed self-assembling film on a metal-containing film, or the like to provide a film (directed self-assembling film) having a phase separation structure induced by directed self-assembling, and removing a part of the plurality of phases in the directed self-assembling film such that a pattern of the directed self-assembling film is formed.

According to the pattern-forming method, a neutralizing organic film may be provided on the obtained metal-containing film, or the surface of the metal-containing film may be treated with a base treating agent for the directed self-assembling film. In addition, in the pattern-forming method, a prepattern may be formed on the metal-containing film.

The composition for forming the neutralizing organic film is exemplified by a composition that contains a polymer having a structural unit identical to the structural unit included in a polymer in a composition for forming a directed self-assembling film described later, and the like. Moreover, the base treating agent is exemplified by a variety of agents that give rise to a functional group on the surface of the metal-containing film, and the like.

In the formation of the directed self-assembling film, coating the composition for forming a directed self-assembling film on the metal-containing film (i.e., directly on the metal-containing film, or on the neutralizing organic film in a case where the neutralizing organic film is provided on the metal-containing film) to provide a coating film, followed by annealing or the like can accelerate directed self-assembling, as generally referred to, i.e., spontaneous formation of an ordered pattern through assembly of sites having identical properties each other. Accordingly, the phase separation structure is formed on the metal-containing film or the like. It is to be noted that the phase separation structure formed in this step is constituted with a plurality of phases, and although phase boundaries between these phases are typically substantially perpendicular to the surface of the substrate, the phase boundaries per se may not necessarily be well-defined. The phase separation structure thus obtained may be precisely controlled by the neutralizing organic film, the prepattern or the like which may be provided on the metal-containing film.

The composition for forming a directed self-assembling film is not particularly limited as long as the composition exhibits a property of forming a phase separation structure through directed self-assembling, and exemplary compositions for forming a directed self-assembling film contain: at least one polymer selected from the group consisting of a block copolymer, and a mixture of two or more types of polymers that are not compatible with each other; and an organic solvent. Of these, the polymer is more preferably a block copolymer, still more preferably a block copolymer constituted with a styrene unit and a methacrylic acid ester unit, and particularly preferably a diblock copolymer constituted with a styrene unit and a methyl methacrylate unit, in light of the possibility of more favorable formation of the phase separation structure.

Although the method for coating the composition for forming a directed self-assembling film on the substrate to provide a coating film is not particularly limited, examples thereof include a method that involves coating the composition for forming a directed self-assembling film through, e.g., a spin coating process, and the like.

The annealing process may include, for example, heating at a temperature of 80° C. to 400° C., and preferably 80° C. to 300° C. in an oven, on a hot plate, etc., and the like. The annealing time period is typically 10 sec to 120 min, and preferably 30 sec to 60 min. The film thickness of the directed self-assembled film thus obtained is preferably 0.1 nm to 500 nm, and more preferably 0.5 nm to 100 nm.

Removing Step

In this step, a part of the plurality of phases of the phase separation structure included in the directed self-assembling film are removed such that a pattern of the directed self-assembling film is formed. A part of the plurality of phases can be removed through an etching treatment by utilizing the difference in an etching rate between the phases separated through directed self-assembling, and the like.

As the procedure for removing a part of the plurality of phases of the phase separation structure included in the directed self-assembling film, well-known procedures, e.g., reactive ion etching (RIE) such as chemical dry etching and chemical wet etching; physical etching such as sputter etching and ion beam etching, and the like may be exemplified.

Of these, reactive ion etching (RIE) is preferred, and in particular, chemical dry etching carried out by using $CF_4$, $O_2$ gas or the like, and chemical wet etching (wet development) carried out by using an etching solution, i.e., an organic solvent such as methyl isobutyl ketone (MIBK) and 2-propanol (IPA), or a liquid such as hydrofluoric acid, are more preferred.

Etching Step

In this step, using the pattern configured with a part of the plurality of phases of residual phase separation film as a mask, the metal-containing film and the substrate (together with the organic underlayer film, in the case of having provided the organic underlayer film on the substrate) are etched to permit patterning. After completion of the patterning onto the substrate, the phases used as a mask are removed from the substrate by a dissolving treatment or the like, whereby a patterned substrate (pattern) can be finally obtained. Examples of the pattern obtained include line-and-space patterns, hole patterns, and the like. As the procedure for the etching, the procedure similar to that for the etching described in connection with the removing step, and the like may be exemplified, and the etching gas and the etching solution may be appropriately selected according to the materials of the metal-containing film and the substrate. For example, in a case where the substrate is made from a silicon material, a gas mixture of a chlorofluorocarbon gas and $SF_4$, or the like may be used. Alternatively, in a case where the substrate is a metal film, a gas mixture of $BCl_3$ and $Cl_2$, or the like may be used. The pattern obtained according to the pattern-forming method is suitably used for semiconductor elements and the like, and further the semiconductor elements are widely used for LEDs, solar cells and the like.

EXAMPLES

Hereinafter, the present invention will be explained more specifically by way of Examples, but the present invention is not limited to these Examples. Determination of each physical property in Examples was made according to the following method.

Weight Average Molecular Weight (Mw) and Number Average Molecular Weight (Mn)

The Mw and the Mn of the polymer were determined by gel permeation chromatography (GPC) using GPC columns (G2000HXL x 2, G3000HXL x 1 and G4000HXL x 1; manufactured by Tosoh Corporation) and mono-dispersed polystyrene as a standard, under the analytical conditions involving: a flow rate of 1.0 mL/min; an elution solvent of tetrahydrofuran; and a column temperature of 40° C. In addition, the dispersity index (Mw/Mn) was calculated based on the results of determination of the Mw and Mn.

Preparation of Composition for Forming Metal-Containing Film

A composition (1) for forming a metal-containing film was prepared by mixing 7.62 parts by mass of (2,4-pentanedionato)tributoxyzirconium (50% by mass in butyl acetate/butanol) as the compound (A), 45.50 parts by mass of propylene glycol monomethyl ether and 41.69 parts by mass of propylene glycol monoethyl ether as the organic solvent (B), 5.00 parts by mass of water (C), and 0.19 parts by mass of diphenyliodonium trifluoromethanesulfonate as the crosslinking accelerator (D) to give a solution, and filtering the solution through a filter with a pore size of 0.2 µm.

Synthesis of Neutralizing Organic Film

Synthesis Example 1

To a flask equipped with a condenser and a stirrer were charged 100 parts by mass of methyl ethyl ketone, and nitrogen substitution was carried out. After heating to 85° C., a mixed solution of 100 parts by mass of methyl ethyl ketone, 51 parts by mass (0.49 parts by mol) of styrene, 49 parts by mass (0.49 parts by mol) of methyl methacrylate and 3 parts by mass (0.027 mol) of mercapto-1,2-propanediol, and a mixed solution of 3 parts by mass of 2,2'-azobis (2,4-dimethylvaleronitrile) and methyl ethyl ketone were each added dropwise over 3 hrs at the same temperature, and this temperature was kept for 3 hrs to permit the polymerization. The obtained resin solution was subjected to purification by precipitation using 3 L of methanol, whereby residual monomers, the initiator and the like were removed to yield a resin. The obtained resin had an Mw of 7,285, an Mn of 5,465 and an Mw/Mn of 1.33. Next, the obtained resin was diluted with propylene glycol monomethyl ether acetate to give a 10% by mass resin solution. This solution was designated as resin solution (A-1).

Synthesis Example 2

Under a nitrogen atmosphere, 32.6 parts by mass (0.166 parts by mol) of 3-mercaptopropyltrimethoxysilane and 31.9 parts by mass (0.179 parts by mol) of n-butyltrimethoxysilane were charged into a three-neck flask, then 100 parts by mass of methyl isobutyl ketone were added to achieve dissolution, and the obtained solution was warmed to 60° C. with stirring by a magnetic stirrer. To this solution were added continuously over 1 hour 8.6 parts by mass of an aqueous oxalic acid solution containing 1% by mass of oxalic acid, and the reaction was allowed to proceed at 60° C. for 4 hrs. Thereafter, water, methanol and methyl isobutyl ketone were distilled off under a reduced pressure. The obtained product was dissolved in toluene, washed three times with water in a separatory funnel, and dehydrated over a drying agent. Subsequently, toluene was distilled off under a reduced pressure, and then the residue was diluted with propylene glycol monomethyl ether acetate to give a 10% by mass resin solution. The obtained resin was found to have an Mw of 2,615, an Mn of 1,214 and an Mw/Mn of 2.15, as determined by GPC. This solution was designated as polysiloxane resin solution (a-1). IR spectroscopy of the obtained polysiloxane resin solution (a-1) was executed, and an absorption band ascribed to the silanol group was found at 3,750 cm$^{-1}$. Next, to a flask equipped with a condenser and a stirrer were charged 100 parts by mass of methyl ethyl ketone, and nitrogen substitution was carried out. After heating to 85° C., a mixed solution of 100 parts by mass of methyl ethyl ketone, 51 parts by mass (0.49 parts by mol) of styrene, 49 parts by mass (0.49 parts by mol) of methyl methacrylate and 30 parts by mass of the polysiloxane resin solution (a-1), and a mixed solution of 3 parts by mass of 2,2'-azobis(2-methylpropionitrile) and methyl ethyl ketone were each added dropwise over 3 hrs at the same temperature, and this temperature was kept for 3 hrs to permit the polymerization. The obtained resin solution was subjected to purification by precipitation using 3 L of methanol, whereby residual monomers, the initiator and the like were removed to yield a resin. The obtained resin had an Mw of 8,280, an Mn of 4,465 and an Mw/Mn of 1.84. Next, the obtained resin was diluted with propylene glycol monomethyl ether acetate to give a 10% by mass resin solution. This solution was designated as resin solution (A-2).

Synthesis of Block Copolymer

Synthesis Example 3

After a 500 mL flask as a reaction vessel was dried under reduced pressure, 200 g of tetrahydrofuran, which had undergone a dehydrating treatment and distillation, was charged under a nitrogen atmosphere, and cooled to −78° C. Thereafter, 1.09 mL (0.98 mmol) of a 1 N sec-butyllithium (sec-BuLi) solution in cyclohexane was charged, and then 10.7 g (0.103 mol) of styrene, which had undergone a dehydrating treatment and distillation, was added dropwise over 30 min. In this dropwise addition, the internal temperature of the reaction solution was carefully adjusted so as not to be −60° C. or higher. After completion of the dropwise addition, the mixture was aged for 30 min, then 3.91 mL (1.96 mmol) of a 0.50 mol/L solution of lithium chloride and 0.52 mL (2.94 mmol) of diphenylethylene were added, and this mixture was sufficiently stirred. Subsequently, 10.3 g (0.103 mol) of methyl methacrylate, which had undergone a dehydrating treatment and distillation, was added dropwise over 30 min. Thereafter, this mixture was aged for 120 min, and a small amount of dehydrated methanol was added to allow a polymerization end to be deactivated. The obtained resin solution was subjected to purification by precipitation in methanol, and the precipitates were filtered off to obtain a solid content.

The obtained white solid was diluted so as to give a 10% by mass resin solution in methyl isobutyl ketone, and to this was added 500 g of a 1% by mass aqueous oxalic acid solution with stirring. After the mixture was left to stand, the underlayer, i.e., an aqueous layer, was discarded. This operation was repeated three times to remove a Li metal. Then, 500 g of ultra pure water was added with stirring, and the underlayer, i.e., an aqueous layer, was discarded. This operation was repeated three times to remove oxalic acid. Thereafter, the solution was concentrated, and the concentrated solution was added dropwise to 2,000 g of methanol to deposit a polymer. The resin obtained after vacuum filtration was washed twice with methanol, followed by drying at 60° C. under reduced pressure to obtain a block copolymer as a white solid. The obtained block copolymer had an Mw of 37,600, an Mn of 36,500 and an Mw/Mn of 1.03. Next, the block copolymer was diluted with propylene glycol monomethyl ether acetate to give a 10% by mass resin solution. This solution was designated as resin solution (B-1).

Synthesis Example 4

After a 500 mL flask as a reaction vessel was dried under reduced pressure, 200 g of tetrahydrofuran, which had undergone a dehydrating treatment and distillation, was charged under a nitrogen atmosphere, and cooled to −78° C. Thereafter, 1.28 mL (1.24 mmol) of a 1 N sec-butyllithium (sec-BuLi) solution in cyclohexane was charged, and 8.39 g (0.0806 mol) of styrene, which had undergone a dehydrating treatment and distillation, was added dropwise over 30 min. In this dropwise addition, the internal temperature of the reaction solution was carefully adjusted so as not to be −60° C. or higher. After completion of the dropwise addition, the mixture was aged for 30 min, then 4.96 mL (2.48 mmol) of a 0.50 mol/L solution of lithium chloride and 0.66 mL (3.72 mmol) of diphenylethylene were added, and this mixture was sufficiently stirred. Subsequently, 22.6 g (0.0535 mol) of [3-tris(trimethylsilyloxy)silyl]propyl methacrylate, which had undergone a dehydrating treatment and distillation, was added dropwise over 30 min. Thereafter, this mixture was aged for 120 min, and a small amount of dehydrated methanol was added to allow a polymerization end to be deactivated. The obtained resin solution was subjected to purification by precipitation in methanol, and the precipitates were filtered off to obtain a solid content.

The obtained white solid was diluted so as to give a 10% by mass resin solution in methyl isobutyl ketone, and to this was added 500 g of a 1% by mass aqueous oxalic acid solution with stirring. After the mixture was left to stand, the underlayer, i.e., an aqueous layer, was discarded. This operation was repeated three times to remove a Li metal. Then, 500 g of ultra pure water was added with stirring, and the underlayer, i.e., an aqueous layer, was discarded. This operation was repeated three times to remove oxalic acid. Thereafter, the solution was concentrated, and the concentrated solution was added dropwise to 2,000 g of methanol to deposit a polymer. The resin obtained after vacuum filtration was washed twice with methanol, followed by drying at 60° C. under reduced pressure to obtain a block copolymer as a white solid. The obtained block copolymer had an Mw of 21,500, an Mn of 19,000 and an Mw/Mn of 1.13. Next, the block copolymer was diluted with propylene glycol monomethyl ether acetate to give a 10% by mass resin solution. This solution was designated as resin solution (B-2).

Example 1

A metal-containing film having a diameter of 300 mm and a film thickness of 20 nm was provided on a silicon wafer as a substrate by coating the composition (1) for forming a metal-containing film prepared above on the silicon wafer using a spin coater, and subjecting the coated composition to baking on a hot plate at 250° C. for 60 sec. An organic film exhibiting a microphase separation and having a film thickness of 20 nm was provided on the metal-containing film by coating the resin solution (B-1) on the metal-containing film and subjecting the coated resin solution (B-1) to baking at 210° C. for 180 sec. The organic film exhibiting a microphase separation, the metal-containing film and the substrate were sequentially dry etched using a dry etching apparatus (Telius SCCM, manufactured by Tokyo Electron Limited) to obtain a patterned substrate.

Example 2

A metal-containing film having a diameter of 300 mm and a film thickness of 20 nm was provided on a silicon wafer as a substrate by coating the composition (1) for forming a metal-containing film prepared above on the silicon wafer using a spin coater, and subjecting the coated composition to baking on a hot plate at 250° C. for 60 sec. A neutralizing organic film was provided on the metal-containing film by coating the resin solution (A-1) on the metal-containing film and subjecting the coated resin solution (A-1) to baking at 210° C. for 120 sec. Furthermore, an organic film exhibiting a microphase separation and having a film thickness of 20 nm was provided on the obtained multilayer film by coating the resin solution (B-1) on the multilayer film and subjecting the coated resin solution (B-1) to baking at 210° C. for 180 sec. The organic film exhibiting a microphase separation, the metal-containing film and the substrate were sequentially dry etched using a dry etching apparatus (Telius SCCM, manufactured by Tokyo Electron Limited) to obtain a patterned substrate.

Example 3

A metal-containing film having a diameter of 300 mm and a film thickness of 20 nm was provided on a silicon wafer as a substrate by coating the composition (1) for forming a metal-containing film prepared above on the silicon wafer using a spin coater, and subjecting the coated composition to baking on a hot plate at 250° C. for 60 sec. A neutralizing organic film was provided on the metal-containing film by coating the resin solution (A-2) on the metal-containing film and subjecting the coated resin solution (A-2) to baking at 210° C. for 120 sec. Furthermore, an organic film exhibiting a microphase separation and having a film thickness of 20 nm was provided on the obtained multilayer film by coating the resin solution (B-1) on the multilayer film and subjecting the coated resin solution (B-1) to baking at 210° C. for 180 sec. The organic film exhibiting a microphase separation, the metal-containing film and the substrate were sequentially dry etched using a dry etching apparatus (Telius SCCM, manufactured by Tokyo Electron Limited) to obtain a patterned substrate.

Example 4

A metal-containing film having a diameter of 300 mm and a film thickness of 20 nm was provided on a silicon wafer as a substrate by coating the composition (1) for forming a metal-containing film prepared above on the silicon wafer using a spin coater, and subjecting the coated composition to baking on a hot plate at 250° C. for 60 sec. An organic film exhibiting a microphase separation and having a film thickness of 20 nm was provided on the metal-containing film by coating the resin solution (B-2) on the metal-containing film and subjecting the coated resin solution (B-2) to baking at 210° C. for 180 sec. The organic film exhibiting a microphase separation, the metal-containing film and the substrate were sequentially dry etched using a dry etching apparatus (Telius SCCM, manufactured by Tokyo Electron Limited) to obtain a patterned substrate.

Example 5

A metal-containing film having a diameter of 300 mm and a film thickness of 20 nm was provided on a silicon wafer as a substrate by coating the composition (1) for forming a metal-containing film prepared above on the silicon wafer using a spin coater, and subjecting the coated composition to baking on a hot plate at 250° C. for 60 sec. A neutralizing organic film was provided on the metal-containing film by coating the resin solution (A-1) on the metal-containing film and subjecting the coated resin solution (A-1) to baking at 210° C. for 120 sec. Furthermore, an organic film exhibiting a microphase separation and having a film thickness of 20 nm was provided on the obtained multilayer film by coating the resin solution (B-2) on the multilayer film and subjecting the coated resin solution (B-2) to baking at 210° C. for 180 sec. The organic film exhibiting a microphase separation, the metal-containing film and the substrate were sequentially dry etched using a dry etching apparatus (Telius SCCM, manufactured by Tokyo Electron Limited) to obtain a patterned substrate.

Example 6

A metal-containing film having a diameter of 300 mm and a film thickness of 20 nm was provided on a silicon wafer as a substrate by coating the composition (1) for forming a metal-containing film prepared above on the silicon wafer using a spin coater, and subjecting the coated composition to baking on a hot plate at 250° C. for 60 sec. A neutralizing organic film was provided on the metal-containing film by coating the resin solution (A-2) on the metal-containing film and subjecting the coated resin solution (A-2) to baking at 210° C. for 120 sec. Furthermore, an organic film exhibiting a microphase separation and having a film thickness of 20 nm was provided on the obtained multilayer film by coating the resin solution (B-2) on the multilayer film and subjecting the coated resin solution (B-2) to baking at 210° C. for 180 sec. The organic film exhibiting a microphase separation, the metal-containing film and the substrate were sequentially dry etched using a dry etching apparatus (Telius SCCM, manufactured by Tokyo Electron Limited) to obtain a patterned substrate.

Evaluation Methods

The organic films exhibiting a microphase separation provided as described above, and the formed substrate patterns were observed using a scanning electron microscope (S-4800, manufactured by Hitachi, Ltd.), and the evaluation of the microphase separation ability based on fingerprint representation of the organic film exhibiting a microphase separation and the evaluation of the rectangularity of the substrate pattern were made.

The microphase separation ability was evaluated to be "A (favorable)" when a well-defined phase separation could be found in the fingerprint representation with no defect, whereas to be "B (unfavorable)" when in the fingerprint representation, a phase separation was imperfectly attained and/or defects were further found. The rectangularity of the substrate pattern was evaluated to be "A" (favorable) when the substrate pattern could be deemed to be rectangular, whereas to be "B (unfavorable)" when the substrate pattern could not be deemed to be rectangular. The results of the evaluation of each organic film and substrate pattern are shown in Table 1.

TABLE 1

|  | Microphase separation ability | Rectangularity of substrate pattern |
| --- | --- | --- |
| Example 1 | A | A |
| Example 2 | A | A |
| Example 3 | A | A |
| Example 4 | A | A |
| Example 5 | A | A |
| Example 6 | A | A |

As is clear from the results shown in Table 1, according to the pattern-forming method of Examples, a well-defined phase separation of the organic films could be found, and a substrate pattern superior in rectangularity could be formed.

According to the pattern-forming method of the embodiments of the present invention, a substrate pattern that is finer and superior in rectangularity can be formed. Therefore, the pattern-forming method can be suitably used for lithography processes in manufacture of various types of electronic devices such as semiconductor devices and liquid crystal devices for which further miniaturization is demanded.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
applying a composition directly or indirectly on a substrate to provide a metal-containing film directly or indirectly on the substrate;
providing a directed self-assembling film directly or indirectly on the metal-containing film such that a plurality of phases of the directed self-assembling film is formed;
removing at least a part of the plurality of phases of the directed self-assembling film such that a pattern of the directed self-assembling film is formed;
sequentially etching the metal-containing film and the substrate using the pattern of the directed self-assembling film as a mask to obtain a patterned substrate; and
totally removing the directed self-assembling film and the metal-containing film from the substrate after the patterned substrate is obtained,
wherein the composition comprises:
a hydrolyzable compound which is a metal compound comprising a hydrolyzable group, a hydrolysis product of a metal compound comprising a hydrolyzable group, a hydrolytic condensation product of a metal compound comprising a hydrolyzable group, or a combination thereof; and
an organic solvent.

2. The pattern-forming method according to claim 1, wherein a metal element of the metal compound is a group 3 element, a group 4 element, a group 5 element, a group 6 element, a group 12 element, a group 13 element, or a combination thereof.

3. The pattern-forming method according to claim 2, wherein the metal element of the metal compound is titanium, zirconium or a combination thereof.

4. The pattern-forming method according to claim 1, wherein the directed self-assembling film is provided using a composition for forming a directed self-assembling film which comprises:
a block copolymer, a mixture of two or more types of polymers that are not compatible with each other, or a combination thereof; and
an organic solvent.

5. The pattern-forming method according to claim 1, further comprising:
providing an organic underlayer film on the substrate before providing the metal-containing film,
wherein the organic underlayer film is etched when the metal-containing film and the substrate is sequentially etched.

6. The pattern-forming method according to claim 1, wherein the composition further comprises water.

7. The pattern-forming method according to claim 1, wherein the composition further comprises a crosslinking accelerator.

8. The pattern-forming method according to claim 1, wherein the hydrolyzable compound is a metal alkoxide, a metal carboxylate, or a metal complex.

9. The pattern-forming method according to claim 6, wherein a content of the water is 0.1 parts by mass to 10 parts by mass with respect to 100 parts by mass of the composition.

10. The pattern-forming method according to claim 6, wherein a content of the water is 1 part by mass to 8 parts by mass with respect to 100 parts by mass of the composition.

11. The pattern-forming method according to claim 7, wherein the crosslinking accelerator is an onium salt compound, an N-sulfonyloxyimide compound or both thereof.

12. The pattern-forming method according to claim 7, wherein the crosslinking accelerator is an onium salt compound.

13. The pattern-forming method according to claim 7, wherein a content of the crosslinking accelerator is no less than 0.1 parts by mass and no greater than 5 parts by mass with respect to 100 parts by mass of the hydrolyzable compound.

* * * * *